United States Patent [19]

Verma

[11] Patent Number: 5,175,129

[45] Date of Patent: Dec. 29, 1992

[54] METHOD OF FABRICATING A SEMICONDUCTOR STRUCTURE HAVING AN IMPROVED POLYSILICON LAYER

[75] Inventor: Jaipal S. Verma, Austin, Tex.

[73] Assignee: Motorola, Inc., Schaumburg, Ill.

[21] Appl. No.: 662,657

[22] Filed: Mar. 1, 1991

[51] Int. Cl.⁵ .......................................... H01L 21/4763
[52] U.S. Cl. ........................... 437/233; 437/238; 437/241; 437/967
[58] Field of Search ............... 437/233, 967, 238, 241; 148/DIG. 122

[56] References Cited

FOREIGN PATENT DOCUMENTS

| 45268 | 4/1977 | Japan | 437/233 |
|---|---|---|---|
| 131434 | 6/1986 | Japan | 437/233 |
| 1-83114 | 7/1989 | Japan | 437/233 |

Primary Examiner—George Fourson
Attorney, Agent, or Firm—Miriam Jackson

[57] ABSTRACT

A semiconductor structure having an improved polysilicon layer is formed. After the formation of a silicon dioxide layer over a semiconductor wafer, the semiconductor wafer is heated in an ambient comprised of nitrogen. The heating is preferably accomplished so that nitridation of the silicon dioxide does not take place. Subsequently, a polysilicon layer is formed on the silicon dioxide layer. The polysilicon layer is denser and thus more resistant to hydrogen fluoride than polysilicon formed without exposing the silicon dioxide layer to nitrogen.

5 Claims, 1 Drawing Sheet

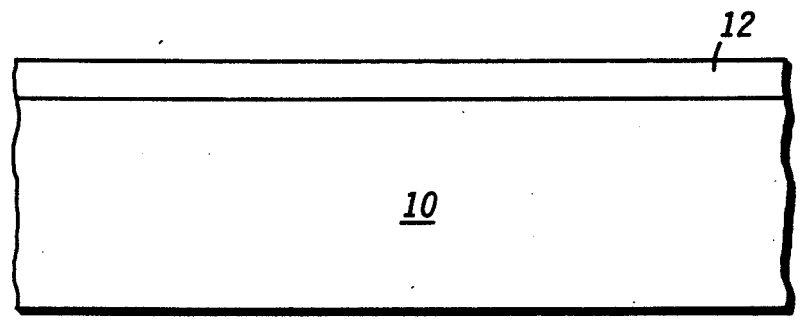
FIG. 1
FIG. 2
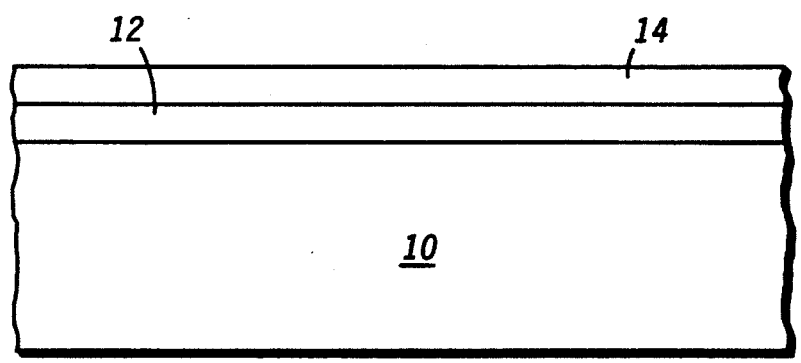

METHOD OF FABRICATING A SEMICONDUCTOR STRUCTURE HAVING AN IMPROVED POLYSILICON LAYER

BACKGROUND OF THE INVENTION

This invention relates, in general, to fabricating a semiconductor structure, and more particularly, to forming a semiconductor device having an improved polysilicon layer.

Thin polysilicon layers are widely used in fabricating very large scale integrated circuits (VLSI). Typically, polysilicon layers, are formed over a silicon dioxide (gate oxide) layer. Hydrogen fluoride is also used in the processing of these integrated circuits to etch out a native oxide present in contact and buried contact areas or for general cleaning of the surface of the integrated circuit during processing. Because polysilicon is quite porous, hydrogen fluoride will penetrate a thin polysilicon film (less than approximately 500 angstroms), and attack the underlying oxide layer. This is a potential process problem which can lower the gate rupture voltage, increase gate oxide defectivity, and degrade the reliability and the yield of semiconductor devices due to the loss of gate oxide integrity.

A thicker polysilicon layer would prevent the penetration of hydrogen fluoride to the underlying oxide. However, it is necessary to form a thin polysilicon layer in forming high density integrated circuits. A method of reducing the porosity of a polysilicon layer is known. This is accomplished by introducing a delay between the deposition of the gate oxide layer and the thin polysilicon layer. Some improvement is obtained by this method, however, further improvements are desirable. Thus, it would be desirable to form a polysilicon layer which prevents the penetration of hydrogen fluoride through it and thus prevents the resultant degradation of gate oxide.

SUMMARY OF THE INVENTION

The advantages of the present invention are provided by a method of fabricating a semiconductor structure having an improved polysilicon layer. An oxide layer is formed over a semiconductor wafer, which is then heated in an ambient comprised of nitrogen. A polysilicon layer is thereafter formed on the oxide layer.

BRIEF DESCRIPTION OF THE DRAWINGS

FIGS. 1 and 2 illustrate enlarged, cross-sectional views of an embodiment of the present invention during various stages of fabrication.

DETAILED DESCRIPTION OF THE PREFERRED EMBODIMENTS

A portion of a semiconductor wafer 10 is shown, upon which a silicon dioxide layer 12 is formed. Silicon dioxide layer 12, typically a gate oxide layer, is formed by any conventional, well known method. Subsequent to the deposition of silicon dioxide 12, wafer 10 is heated in an ambient comprised of nitrogen. Preferably, wafer 10 is heated at a temperature and time where nitridation of silicon dioxide layer 12 does not take place. Nitridation refers to a condition when nitrogen gets into the structure at the surface of silicon dioxide 12 or at the interface of silicon dioxide layer 12 and semiconductor wafer 10, called a trapping center generation which may cause threshold shifting. An example of a suitable time and temperature is approximately one minute and approximately 800° C. to 900° C. However, a longer time and different temperature may still be used, but nitridation of silicon dioxide 12 may take place, which is not desirable. Ammonia or other chemical compositions may be used to provide a nitrogen ambient.

FIG. 2 illustrates the structure of FIG. 1 further along in the process. A polysilicon layer 14 is formed on silicon dioxide 12. Polysilicon layer 14 is formed by conventional methods well known in the art. In this invention, however, polysilicon layer 14 becomes denser and thus more resistant to hydrogen fluoride when polysilicon layer 14 is formed over silicon dioxide 12 which has been heated in a nitrogen ambient. By the introduction of nitrogen, a greater degree of cross-linking is created because nitrogen atoms replace the oxygen atoms in silicon dioxide 12 which is believed to provide for a different growth mechanism of polysilicon layer 14 to create a polysilicon layer 14 which is denser in nature than a pure polysilicon layer grown over an oxide layer which has not been exposed to nitrogen. Because polysilicon layer 14 is resistant to hydrogen fluoride, underlying silicon dioxide 12 is protected.

As can be readily seen, the present invention allows for fabricating a thin polysilicon layer in which the porosity is low enough to prevent the penetration of hydrogen fluoride. Preventing the penetration of hydrogen fluoride maintains the integrity of the silicon dioxide present below the polysilicon layer. Semiconductor devices which are fabricated according to the present invention do not exhibit severe degradation in gate rupture voltage as do semiconductor devices not fabricated in accordance with the present invention. Oxide properties remain unchanged because nitridation effects can be avoided.

I claim:

1. A method of fabricating a semiconductor structure, comprising the steps of:
   providing a semiconductor wafer;
   forming a silicon dioxide layer on the semiconductor wafer;
   heating the semiconductor wafer in an ambient comprised of nitrogen for approximately one minute, such that nitridation of the silicon dioxide layer does not take place; and
   forming a polysilicon layer on the silicon dioxide layer.

2. The method of claim 1 wherein the heating of the semiconductor wafer entails heating at a temperature of approximately 800° C. to 900° C.

3. A method of fabricating a semiconductor structure, comprising the steps of:
   providing a semiconductor wafer;
   forming a silicon dioxide layer on the semiconductor wafer;
   heating the semiconductor wafer in an ambient comprised of ammonia for approximately one minute, such that nitridation of the silicon dioxide layer does not take place; and
   forming a polysilicon layer on the silicon dioxide layer.

4. The method of claim 3 wherein the heating of the semiconductor wafer entails heating at a temperature of approximately 800° C. to 900° C.

5. A method of fabricating a semiconductor structure, comprising the steps of:

providing a semiconductor wafer;

forming a gate silicon dioxide layer on the semiconductor wafer;

heating the semiconductor wafer in an ambient comprised of nitrogen at a temperature of approximately 800° C. to 900° C. for approximately one minute, such that nitridation of the gate silicon dioxide layer does not take place; and forming a polysilicon layer on the gate silicon dioxide layer.

* * * * *